(12) United States Patent
Krawinkel et al.

(10) Patent No.: US 9,487,684 B2
(45) Date of Patent: Nov. 8, 2016

(54) CROSS-LINKABLE ADHESIVE COMPOUND WITH HARD AND SOFT BLOCKS AS A PERMEANT BARRIER

(71) Applicant: tesa SE, Hamburg (DE)

(72) Inventors: Thorsten Krawinkel, Hamburg (DE); Klaus Keite-Telgenbüsher, Hamburg (DE); Judith Grünauer, Hamburg (DE); Jan Ellinger, Hamburg (DE)

(73) Assignee: tesa SE, Norderstedt (DE)

( * ) Notice: Subject to any disclaimer, the term of this patent is extended or adjusted under 35 U.S.C. 154(b) by 0 days.

(21) Appl. No.: 14/389,596

(22) PCT Filed: Mar. 25, 2013

(86) PCT No.: PCT/EP2013/056287
§ 371 (c)(1),
(2) Date: Sep. 30, 2014

(87) PCT Pub. No.: WO2013/156271
PCT Pub. Date: Oct. 24, 2013

(65) Prior Publication Data
US 2015/0079389 A1    Mar. 19, 2015

(30) Foreign Application Priority Data
Apr. 17, 2012  (DE) .................. 10 2012 206 273

(51) Int. Cl.
| | | |
|---|---|---|
| C08K 5/07 | (2006.01) | |
| C09J 153/02 | (2006.01) | |
| C08F 8/36 | (2006.01) | |
| C09J 7/02 | (2006.01) | |
| C09J 193/04 | (2006.01) | |
| C09J 11/06 | (2006.01) | |
| C09J 5/02 | (2006.01) | |
| C09J 5/06 | (2006.01) | |
| C09J 153/00 | (2006.01) | |
| C08K 5/00 | (2006.01) | |
| H01L 51/52 | (2006.01) | |
| C08L 91/00 | (2006.01) | |

(52) U.S. Cl.
CPC .............. *C09J 153/025* (2013.01); *C08F 8/36* (2013.01); *C09J 5/02* (2013.01); *C09J 5/06* (2013.01); *C09J 7/02* (2013.01); *C09J 7/0203* (2013.01); *C09J 7/0221* (2013.01); *C09J 11/06* (2013.01); *C09J 153/00* (2013.01); *C09J 193/04* (2013.01); *C08K 5/0091* (2013.01); *C08K 5/07* (2013.01); *C08L 91/00* (2013.01); *C08L 2205/02* (2013.01); *C09J 2203/318* (2013.01); *C09J 2453/00* (2013.01); *H01L 51/5246* (2013.01); *H01L 2924/0002* (2013.01); *Y10T 428/2852* (2015.01)

(58) Field of Classification Search
CPC ......... C09J 153/025; C09J 11/06; C09J 7/02
See application file for complete search history.

(56) References Cited

U.S. PATENT DOCUMENTS

| | | | |
|---|---|---|---|
| 3,642,953 A | 2/1972 | Oneill et al. | |
| 4,051,195 A | 9/1977 | McWhorter | |
| 4,058,401 A | 11/1977 | Crivello | |
| 4,138,255 A | 2/1979 | Crivello | |
| 4,231,951 A | 11/1980 | Smith et al. | |
| 4,256,828 A | 3/1981 | Smith | |
| 4,552,604 A | 11/1985 | Green | |
| 5,066,694 A * | 11/1991 | Agarwal et al. | ................. 524/60 |
| 6,908,722 B2 | 6/2005 | Ebata et al. | |
| 8,460,969 B2 | 6/2013 | Krawinkel et al. | |
| 2007/0021569 A1 | 1/2007 | Willis et al. | |
| 2007/0135552 A1 | 6/2007 | Wrosch et al. | |
| 2007/0217553 A1* | 9/2007 | Brown et al. | ................. 375/349 |
| 2007/0270553 A1 | 11/2007 | Bohm et al. | |
| 2008/0139734 A1 | 6/2008 | Nakashima et al. | |
| 2010/0012271 A1 | 1/2010 | Krawinkel | |
| 2010/0048817 A1 | 2/2010 | Dado et al. | |
| 2010/0063221 A1 | 3/2010 | Manabe et al. | |
| 2010/0068514 A1 | 3/2010 | Ellinger et al. | |
| 2010/0203785 A1 | 8/2010 | Willis et al. | |
| 2011/0036623 A1 | 2/2011 | Keite-Telgenbüscher et al. | |
| 2011/0121356 A1 | 5/2011 | Krawinkel et al. | |

FOREIGN PATENT DOCUMENTS

| | | |
|---|---|---|
| CN | 101228192 A | 7/2008 |
| DE | 10 2008 047 964 A1 | 3/2010 |

(Continued)

OTHER PUBLICATIONS

International Search Report dated May 28, 2013, mailed Jun. 4, 2013.
English Translation of International Search Report dated May 28, 2013, mailed Jun. 4, 2013.
German Search Report dated Nov. 23, 2012.
English Translation Office Action of corresponding Chinese Patent Application No. 201380025752.7.

*Primary Examiner* — Robert Harlan
(74) *Attorney, Agent, or Firm* — Norris McLaughlin & Marcus P.A.

(57) ABSTRACT

Adhesive compound as a permeant barrier, comprising (i) block copolymers having a construction A-B-A, (A-B)$_n$, (A-B)$_n$X, or (A-B-A)$_n$X, where X is the radical of the coupling reagent, n is a whole number between 2 and 10, A is a polymer made of a vinyl aromatic compound and B is a polymer block made of an alkene or diene, wherein this polymer block can also be hydrated, with the condition that at least part of the A blocks is sulfonated, optionally with two-block copolymers in the form of A-B as an admixture component, and (ii) at least one tackifier resin.

26 Claims, 2 Drawing Sheets

(56) References Cited

FOREIGN PATENT DOCUMENTS

| | | |
|---|---|---|
| DE | 10 2008 060 113 A1 | 7/2010 |
| DE | 10 2009 036 968 A1 | 2/2011 |
| DE | 10 2009 036 970 A1 | 2/2011 |
| EP | 1 743 928 A1 | 1/2007 |
| EP | 2 166 593 A1 | 3/2010 |
| JP | 2010 505978 A | 2/2010 |
| JP | 44 75 084 B2 | 6/2010 |
| WO | 98/21287 A1 | 5/1998 |
| WO | 01/92344 A2 | 12/2001 |
| WO | 02/26908 A1 | 4/2002 |
| WO | 2007/010039 A1 | 1/2007 |
| WO | WO 2007/010039 A1 * | 1/2007 ............... C08F 8/36 |
| WO | 2010/063579 A1 | 6/2010 |

* cited by examiner

CROSS-LINKABLE ADHESIVE COMPOUND WITH HARD AND SOFT BLOCKS AS A PERMEANT BARRIER

This is a 371 of PCT/EP2013/056287 filed 25 Mar. 2013, which claims foreign priority benefit under 35 U.S.C. 119 of German Patent Application 10 2012 206 273.4 filed 17 Apr. 2012, the entire contents of which are incorporated herein by reference.

The present invention relates to an adhesive, more particularly a temperature-stable adhesive, comprising (i) block copolymers and also mixtures thereof, having an A-B-A, $(A-B)_n$, $(A-B)_nX$, or $(A-B-A)_nX$ construction, where X is the radical of a coupling reagent, n is an integer between 2 and 10, A is a polymer block of a vinylaromatic, and B is a polymer block of an alkene or diene, it being possible for this polymer block also to have been hydrogenated, with the condition that at least some of the A blocks are sulfonated, and diblock copolymers of the form A-B optionally as an admixture component, and (ii) at least one tackifier resin, and optionally (iii) at least one metal complex with a substitutable complexing agent.

BACKGROUND OF THE INVENTION (Opto)electronic arrangements are being used with ever-increasing frequency in commercial products. They comprise organic or inorganic electronic structures, examples being organic, organometallic or polymeric semiconductors or else combinations of these. Depending on the desired application, they are rigid or flexible in form, there being an increasing demand for flexible arrangements.

Examples of (opto)electronic applications that are already commercial or are of interest in terms of their market potential include electrophoretic or electrochromic constructions or displays, organic or polymeric light-emitting diodes (OLEDs or PLEDs) in readout and display devices or as illumination, electroluminescent lamps, light-emitting electrochemical cells (LEECs), organic solar cells, preferably dye or polymer solar cells, inorganic solar cells, preferably thin-film solar cells, more particularly those based on silicon, germanium, copper, indium and/or selenium, organic field-effect transistors, organic switching elements, organic optical amplifiers, organic laser diodes, organic or inorganic sensors or else organic- or inorganic-based RFID transponders.

A perceived technical challenge for realization of sufficient lifetime and function of (opto)electronic arrangements in the area of organic and/or inorganic (opto)electronics, especially in the area of organic (opto)electronics, is the protection of the components they contain against permeants. Permeants may be atoms, ions or a large number of low molecular mass organic or inorganic compounds, more particularly water vapor and oxygen.

A large number of (opto)electronic arrangements in the area of organic and/or inorganic (opto)electronics, especially where organic raw materials are used, are sensitive not only to water vapor but also to oxygen, and for many arrangements the penetration of water vapor is classed as a relatively severe problem. During the lifetime of the electronic arrangement, therefore, it requires protection by means of encapsulation, since otherwise the performance drops off over the period of application. For example, oxidation of the components, in the case of light-emitting arrangements such as electroluminescent lamps (EL lamps) or organic light-emitting diodes (OLEDs) for instance, may drastically reduce the luminosity, the contrast in the case of electrophoretic displays (EP displays), or the efficiency in the case of solar cells, within a very short time.

In organic and/or inorganic (opto)electronics, particularly in the case of organic (opto)electronics, there is a particular need for flexible bonding solutions which constitute a permeation barrier to permeants, such as oxygen and/or water vapor. The flexible bonding solutions are therefore intended not only to achieve effective adhesion between two substrates, but also, in addition, to fulfill properties such as significantly improved permeation barrier properties, high temperature stability, high shear strength and peel strength, chemical stability, aging resistance, high transparency, ease of processing, and also high flexibility and pliability. In order to be able to ensure a very broad spectrum of application for barrier adhesives, there is also an increasing requirement for improved barrier properties, preferably coupled with a high temperature stability. This combination is needed when, for example, (opto)electronic components are encapsulated which become warm or hot during their operation, whether as a result of the development of heat or because of the surroundings in which they are used. The use of barrier adhesive for producing solar panels or else electronic components which are employed in offshore parks poses particular challenges to the temperature stability and barrier properties of the adhesive.

In order to obtain the most effective sealing, specific barrier adhesives are used. A good adhesive for the sealing of (opto)electronic components has a low permeability for oxygen and particularly for water vapor, has sufficient adhesion to the substrate, and is able to flow well onto the substrate. Owing to incomplete wetting of the surface of the substrate and to pores that remain, low capacity for flow on the substrate may reduce the barrier effect at the interface, since it permits lateral ingress of oxygen and water vapor independently of the properties of the adhesive. Only if the contact between adhesive and substrate is continuous are the properties of the adhesive the determining factor for the barrier effect of the adhesive.

For the purpose of characterizing the barrier effect it is usual to state the oxygen transmission rate OTR and the water vapor transmission rate WVTR. Each of these rates indicates the flow of oxygen or water vapor, respectively, through a film per unit area and unit time, under specific conditions of temperature and partial pressure and also, optionally, further measurement conditions such as relative atmospheric humidity. The lower the values the more suitable the respective material for encapsulation. The statement of the permeation is not based solely on the values of WVTR or OTR, but instead also always includes an indication of the average path length of the permeation, such as the thickness of the material, for example, or a standardization to a particular path length.

The permeability P is a measure of the perviousness of a body for gases and/or liquids. A low P value denotes a good barrier effect. The permeability P is a specific value for a defined material and a defined permeant under steady-state conditions and with defined permeation path length, partial pressure and temperature. The permeability P is the product of diffusion term D and solubility term S:

$$P = D*S$$

The solubility term S describes in the present case the affinity of the barrier adhesive for the permeants. In the case of water vapor, for example, a low value for S is achieved by hydrophobic materials. The diffusion term D is a measure of the mobility of the permeant in the barrier material, and is directly dependent on properties, such as the molecular mobility or the free volume. Often, in the case of highly crosslinked or highly crystalline materials, relatively low values are obtained for D. Highly crystalline materials, however, are generally less transparent, and greater crosslinking results in a lower flexibility. The permeability P typically rises with an increase in the molecular mobility, as for instance when the temperature is raised or the glass transition point is exceeded.

A low solubility term S is usually insufficient for achieving good barrier properties. One classic example of this, in particular, are siloxane elastomers. The materials are extraordinarily hydrophobic (low solubility term), but as a result of their freely rotatable Si—O bond (large diffusion term) have a comparatively low barrier effect for water vapor and oxygen. For a good barrier effect, then, a good balance between solubility term S and diffusion term D is necessary.

Approaches at increasing the barrier effect of an adhesive must take account of the two parameters D and S, with a view in particular to their influence on the permeability of water vapor and oxygen. In addition to these chemical properties, thought must also be given to consequences of physical effects on the permeability, particularly the average permeation path length and interface properties (flow-on behavior of the adhesive, adhesion). The ideal barrier adhesive has low D values and S values in conjunction with very good adhesion to the substrate.

For this purpose use has hitherto been made in particular of liquid adhesives and adhesives based on epoxides (WO 98/21287 A1; U.S. Pat. No. 4,051,195 A; U.S. Pat. No. 4,552,604 A). As a result of a high degree of crosslinking, these adhesives have a low diffusion term D. Their principal field of use is in the edge bonding of rigid arrangements, but also moderately flexible arrangements. Curing takes place thermally or by means of UV radiation. Full-area bonding is hard to achieve, owing to the contraction that occurs as a result of curing, since in the course of curing there are stresses between adhesive and substrate that may in turn lead to delamination.

Using these liquid adhesives harbors a series of disadvantages. For instance, low molecular mass constituents (VOCs—volatile organic compounds) may damage the sensitive electronic structures in the arrangement and may hinder production operations. The adhesive must be applied, laboriously, to each individual constituent of the arrangement. The acquisition of expensive dispensers and fixing devices is necessary in order to ensure precise positioning. Moreover, the nature of application prevents a rapid continuous operation, and the laminating step that is subsequently needed may also make it more difficult, owing to the low viscosity, to achieve a defined layer thickness and bond width within narrow limits.

Furthermore, the residual flexibility of such highly crosslinked adhesives after curing is low. Use of 2-component systems is limited by the potlife, in other words the processing life until gelling has taken place.

Particularly if the (opto)electronic arrangements are to be flexible, it is important that the adhesive used is not too rigid and brittle. Accordingly, pressure-sensitive adhesives (PSAs) and heat-activatedly bondable adhesive sheets are particularly suitable for such bonding. In order to flow well onto the substrate but at the same time to attain a high bonding strength, the adhesives ought initially to be very soft, but then to be able to be crosslinked. As crosslinking mechanisms it is possible, depending on the chemical basis of the adhesive, to implement thermal cures and/or radiation cures.

DE 10 2008 060 113 A1 describes a method for encapsulating an electronic arrangement with respect to permeants, using a PSA based on butylene block copolymers, more particularly isobutylene block copolymers, and describes the use of such an adhesive in an encapsulation method. In combination with the elastomers, defined resins, characterized by DACP and MMAP values, are preferred. The adhesive, moreover, is preferably transparent and may exhibit UV-blocking properties. As barrier properties, the adhesive preferably has a WVTR of <40 $g/m^2*d$ and an OTR of <5000 $g/m^2*d$ bar. In the method, the PSA may be heated during and/or after application. The PSA may be crosslinked—by radiation, for example. The PSA is not temperature-stable.

JP 4,475,084 B1 teaches transparent sealants for organic electroluminescent elements, that may be based on block copolymer. Examples listed are SIS and SBS and also the hydrogenated versions. Not specified, however, are constituents which permit crosslinking after application. Nor are the barrier properties of the sealants addressed. The sealing layer apparently does not take on any specific barrier function.

Additionally described are barrier adhesives based on styrene block copolymers, very substantially hydrogenated and correspondingly hydrogenated resins, DE 10 2008 047 964 A1.

Not only the PSAs based on polyisobutylene but also those based on hydrogenated styrene block copolymers exhibit a significant disadvantage. In the case of bonding between two films provided with a barrier layer, as for example two PET films with an SiOx coating, as may be used, for example, for organic solar cells, severe blistering occurs in the course of storage under humid and hot conditions. Even prior drying of the films and/or adhesive is unable to prevent this blistering.

A particular problem is that in general any kind of functionalization (whose purpose is to provide reactivity) causes an increase in basic polarity and hence an unwanted rise in the water vapor permeability of the adhesive.

SUMMARY OF THE INVENTION

It is an object of the invention to provide an adhesive which exhibits excellent barrier properties with respect to permeants and, moreover, is temperature-stable. The adhesive more particularly is to have excellent barrier properties with respect to water vapor and oxygen across a wide temperature range. Also an object, therefore, is the development of an adhesive which is able to prevent the harmful influence of oxygen and water vapor on sensitive functional layers such as, for example, in the area of organic or inorganic photocells for solar modules, or in the area of organic light-emitting diodes (OLEDs), by means of a good barrier effect with respect to the harmful substances; which is able to permanently join different components of the functional elements to one another; which has good performance at high temperatures and which is readily manageable in adhesive bonding operations; which also allows a flexible and tidy processing; and which is nevertheless easy to process for the producer.

This object is achieved by means of an adhesive as characterized in more detail in the main claim. The dependent claims describe advantageous embodiments of the invention. The object is further achieved by an adhesive which is obtained by the process of the invention, and also by the process of the invention for producing the adhesive itself. Furthermore, the objects are achieved by the use of the adhesive of the invention as specified in the claims.

For reasons given above it was surprising that with the at least partly sulfonated adhesive of the invention, it is possible to achieve excellent barrier properties with respect to permeants, and at the same time the adhesive has an outstanding temperature stability.

The invention provides adhesives, both pressure-sensitive adhesives and hotmelt adhesives, as a permeant barrier, more particularly as a temperature-stable permeant barrier, comprising:

(i) block copolymers and also mixtures thereof, having an A-B-A, (A-B)$_n$, (A-B)$_n$X, or (A-B-A)$_n$X construction, where X is the radical of a coupling reagent, n is an integer between 2 and 10, A is a polymer block (A block) of a vinylaromatic, and B is a polymer block of an alkene or diene, the polymer block B preferably being at least partially hydrogenated, more preferably fully hydrogenated, and at least some of the A blocks being sulfonated, and diblock copolymers of the form A-B, optionally, as an admixture component, more particularly independently a copolymer with A' a polymer block of vinylaromatics and B' a polymer block of an alkene or diene, with n more particularly being in each case independently 2, 3, 4, 5, 6, 7, 8, 9 or 10, and (ii) at least one tackifier resin, and optionally (i) at least one metal complex with a substitutable complexing agent.

DETAILED DESCRIPTION

The adhesive of the invention is preferably a crosslinkable adhesive, more particularly a coordinatively crosslinkable adhesive, preferably based on sulfonated vinylaromatic block copolymers with good processing and coating qualities. They are further notable for good product properties in respect of adhesion and cohesion, and they exhibit outstanding barrier properties with respect to permeants, even at high temperatures. By virtue of the crosslinking it is possible to set a high temperature stability, and at the same time the formation of blisters during storage under heat and humidity can be reliably prevented.

In order to set the invention's barrier properties against permeants, a certain degree of sulfonation is aimed at in the block copolymers, which are then referred to as sulfonated copolymers. Preferred adhesives feature a defined level of sulfonated aromatics in relation to the total amount of said aromatics present.

With preference some of the A blocks of the block copolymer—hereinafter this block copolymer is also referred to as sulfonated copolymer—are present in the form of sulfonated A blocks, and the aromatic moieties thereof are sulfonated to an extent of between greater than or equal to 0.5 mol % per mole of the monomer unit, based on the total monomer units of the A blocks of the sulfonated copolymers, more particularly between greater than or equal to 0.5 to 50 mol %, preferably greater than or equal to 0.5 to 20 mol %. In accordance with the invention the sulfonated copolymer has sulfonated A blocks in which between greater than or equal to 0.5 to 15 mol % of the vinylaromatics, per mole of the monomer unit, are sulfonated, based on the total monomer units of the A blocks in the sulfonated copolymer, more particularly the (i) copolymer, comprising the sulfonated copolymer, comprises A blocks (hard block) of polymerized vinylaromatics, such as styrene, which to an extent of 0.5 to 13 mol % per mole of total vinylaromatics in the A blocks are sulfonated, preferably 1 to 10 mol %, more preferably 1 to 8 mol %, very preferably 3 to 6 mol %; in general, any value may fluctuate by plus/minus 2 mol %, preferably by plus/minus 1 mol %.

The polymers of the adhesive of the present invention are block copolymers and also mixtures thereof having an A-B-A, (A-B)$_n$, (A-B)$_n$X, or (A-B-A)$_n$X construction, where X is the radical of a coupling reagent, n is an integer between 2 and 10, A is a polymer block of a vinylaromatic, and B is a polymer block (component B) of an alkene or diene, it also being possible for this polymer block to be hydrogenated, with the proviso that at least some of the A blocks are sulfonated, and diblock copolymers of the form A-B, optionally, as admixture component.

Customary coupling reagents for the production of diblock, triblock and also multiblock and star block copolymers are known to the skilled person. To name but a few, 2-vinylpyridine, 1,4-di(bromomethyl)benzene, dichlorodimethylsilane, or 1,2-bis(trichloro-silyl)ethane are given by way of example, without the coupling reagents being confined to these. After coupling has taken place, X remains as a residue of these coupling reagents.

Optionally it is also possible to employ unsulfonated block copolymers, more particularly as admixture component of the form A-B, preferably independently with A' blocks (hard block) and B' blocks, for example as A'-B', where A' are polymer blocks of vinylaromatics such as styrene. B' blocks are preferably polymer blocks of hydrogenated linear, branched or cyclic alkenes and/or dienes, having preferably 2 to 8 C atoms as alkene or diene.

Even with low sulfonation, preferably at greater than or equal to 0.5 mol % sulfonation, it is possible surprisingly to achieve an improvement in the barrier effect with respect to permeants. An outstanding barrier effect is already observed for noncrosslinked, dried adhesives comprising the sulfonated polymer. As and when necessary, crosslinking may take place additionally with a metal complex, though this is not absolutely necessary for the barrier effect. Good barrier properties are achieved even at levels in the range from 1 to 15 mol %, preferably 2 to 10 mol %, in each case preferably in relation to the total monomer units of the A blocks of the sulfonated copolymers. The barrier effect may be boosted further if there is additional crosslinking. As a result of the crosslinking, the diffusion of permeants is outstandingly prevented and at the same time, in the case of the additional crosslinking, a good temperature stability is produced for the adhesive, without the adhesive becoming too polar. A disadvantage of a polar adhesive would be the formation of hydrogen bonds with water molecules, causing these adhesives to lack sufficient barrier properties with respect to water. The sulfonation takes place preferably only on the aromatic moiety of the A blocks.

Block copolymers with soft and hard components having significantly divergent $T_g$s generally form a domain structure at room temperature, which is an aim for permeation-inhibiting properties in adhesives. The unmodified block copolymers of styrene blocks and diene/isobutylene/butylene/ethylene/propylene blocks possess shear stability usually only up to 85 or up to 100° C.; in this temperature range, the domain structures begin to break down. A critical point for thermally stable adhesives which at the same time inhibit permeants is an increase in the crosslinking, as far as possible after processing, in order at the start to have adhesives which flow on readily, without causing too much of an increase in the polarity.

Modification may be made in principle to the hard block and/or to the soft block of the block copolymers. It has emerged, however, that modification on the soft block has adverse consequences for the flow behavior of the adhesive. Adhesives thus modified frequently become too hard and exhibit insufficient bonding to numerous substrates.

In accordance with the invention it has been found that the modification, more particularly sulfonation of the hard blocks of the block copolymers, preferably of the aromatic moieties of the alkene-functionalized aromatics such as vinylaromatics, also permits good flow-on in the noncrosslinked state, and that outstanding barrier properties with respect to permeants are possible even at high temperatures. On the basis of the sulfonation, slightly improved shear properties as compared with the unmodified block copolymers are observable even without crosslinking. Subsequent crosslinking of the sulfonic acid groups or sulfonic acid derivatives such as esters, via coordinative crosslinking with a metal, preferably with aluminum of an aluminum chelate, leads to a further significant improvement in the shear properties of the crosslinked adhesives. The metal in the metal chelate is selected according to subsequent application, in order to prevent unwanted contamination with metals in sensitive applications.

The (i) block copolymers preferably comprise sulfonated copolymers in the adhesive with sulfonated A blocks and (unsulfonated) B blocks and also unsulfonated copolymers, more particularly optionally triblock copolymers, or as an admixture component of the form A-B, the admixture component of the form A-B being preferably independently a block copolymer with A' blocks and B' blocks. More particularly the adhesive comprises a block copolymer with crosslinked sulfonated A blocks; with particular preference they are crosslinked coordinatively via metals, more particularly in accordance with metal chelates of the general formula I.

As a result of the selection of the constituents of the adhesive and as a result of the low polarity in spite of sulfonation of the nonpolar vinylaromatic block copolymers and in spite of the resulting low solubility term (S) in the diffusion coefficient, a low capacity for penetration by permeants such as water vapor and oxygen is achieved.

The invention further provides adhesives whose blocks have different $T_g$s (which can be determined by way of DSC), and which allow formation of domains as a result of insolubility of the individual phases in one another. Through the formation of these domains within a block copolymer, it is possible to achieve very good cohesion at room temperature, and improved barrier properties at the same time. It is therefore preferred if in the copolymers (i) the A blocks each independently (A and A') have a $T_g$ of more than 40° C. and the B blocks each independently (B, B') have a $T_g$ of less than 0° C. Even before sulfonation, the A blocks preferably have a $T_g$ of more than 40° C.

Particularly preferred adhesives have a WVTR of less than or equal to 100 g/m$^2$·d. Chelate-crosslinked adhesives preferably have a WVTR of less than or equal to 100 g/m$^2$·d, preferably less than or equal to 95 g/m$^2$·d, more preferably less than or equal to 80 g/m$^2$·d, very preferably less than or equal to 50 g/m$^2$·d, also very preferably less than or equal to 40 g/m$^2$·d, 30 g/m$^2$·d, 20 g/m$^2$·d, or less than or equal to 10 g/m$^2$·d, and/or the chelate-crosslinked adhesive has an OTR of less than or equal to 7000 g/m$^2$·d·bar, more particularly less than or equal to 3000 g/m$^2$·d·bar, preferably less than or equal to 1000 g/m$^2$·d·bar, very preferably less than or equal to 500 g/m$^2$·d·bar.

A further feature of preferred adhesives is that in the copolymers the A blocks are independently homopolymers or copolymers which are formed from vinylaromatics such as styrene or styrene derivatives and/or α-methylstyrene, o-, p-methylstyrene, 2,5-dimethylstyrene, p-methoxystyrene and/or tert-butylstyrene.

Further provided by the invention is an adhesive which comprises (ii) at 10 to 70 wt %, at least one tackifier resin, selected more particularly from hydrocarbon resins, preferably at least partially hydrogenated hydrocarbon resins, preferably at 20 to 70 wt %, more preferably 20 to 65 wt %, very preferably 20 to 55 wt %, also very preferably 20 to 40 wt %, more particularly a hydrocarbon resin from the group of the partially or fully hydrogenated $C_5$ or $C_9$ resins preferably at greater than or equal to 30 to 55 wt %, and (iii) at least one metal complex with a substitutable complexing agent, more particularly of the formula I, and optionally (iv) up to 20 wt %, a plasticizer, more particularly 5 to 15 wt %, and (v) 0.0 to 20 wt %, more particularly 0.0 to 10.0 wt %, preferably in each case 0.0 to 5 wt %, fillers, additives, photoinitiators, accelerators and/or curing agents, (vi) up to 60 wt %, a reactive resin as crosslinker, more particularly 5 to 40 wt %, and (i) the block copolymers and/or mixtures comprising them to 100 wt % in the overall composition of the adhesive, the copolymer being present preferably at greater than or equal to 25 to 80 wt % in the adhesive, more particularly at 25 to 60 wt %, very preferably at 30 to 60 wt %, preferably at 30 to 50 wt %. It is preferred here if the A blocks and the polymeric B blocks are each present in the form of domains.

According to one preferred alternative, a hydrocarbon resin is used as tackifier resin, at in total 20 to 70 wt %, preferably 20 to 65 wt %, more preferably 20 to 55 wt %, advantageously in a weight ratio of 2:1 to 1:2 relative to the reactive resin as crosslinker, preferably around about 1:1 with a fluctuation of plus/minus 0.5.

Adhesives finding application are preferably those based on block copolymers comprising A polymer blocks, predominantly formed by polymerization of vinylaromatics, preferably styrene, and B blocks, predominantly formed by polymerization of alkenes or 1,3-dienes such as, for example, ethylene, propylene, butadiene, isobutylene, and isoprene, or a copolymer of butadiene and isoprene. The products here may also be present in partially or fully hydrogenated form in the diene block. Particularly preferred are block copolymers of polystyrene and at least partially hydrogenated polybutadiene, or of polystyrene and polyisobutylene.

The block copolymers resulting from the A blocks and B blocks may have identical or different B blocks and may contain identical or different A blocks. Likewise possible for use are block copolymers of radical architecture, and also star-shaped and linear multiblock copolymers such as triblock polymers or higher block polymers. Further components present may be A-B diblock copolymers (two-block copolymers). All of the aforementioned polymers may be used alone or in a mixture with one another.

Instead of the preferred polystyrene blocks as A blocks, it is also possible as vinylaromatics to use polymer blocks based on other derivatives of vinylaromatics such as aromatic-containing homopolymers and copolymers (preferably $C_8$ to $C_{12}$ aromatics) having glass transition temperatures of more than 75° C., such as α-methylstyrene-containing aromatic blocks, for example.

In one advantageous embodiment the block copolymers have a polyvinylaromatic fraction (A block) of 10 wt % to 35 wt %. This is true both of the sulfonated copolymers and, independently thereof, of the unsulfonated copolymers.

At least some of the block copolymers used have sulfonation in the vinylaromatic moiety, more particularly with sulfonic acid or a sulfonic acid derivative, preferably an ester. The sulfonation of the aromatics here may be accomplished in a variety of ways. One possible example is a direct sulfonation with concentrated sulfuric acid, or a chlorosulfonation with sulfuryl chloride and subsequent hydrolysis of the chlorosulfonic acid. Very simple and elegant is the reaction with acetyl sulfate or isopropyl sulfate prepared in situ.

In another preferred embodiment, the fraction of the A blocks in the block copolymers is at least 20 wt % in relation to the total mass of the block copolymers. In an alternative preferred embodiment the fraction of the copolymers, preferably of the block copolymers, such as the vinylaromatic block copolymers, in total, based on the overall (pressure-sensitive) adhesive, is at least 20 wt %, preferably at least 30 wt %, more preferably at least 35 wt %. A consequence of too small a fraction of vinylaromatic block copolymers is that the cohesion of the adhesive is relatively low. The maximum fraction of the vinylaromatic block copolymers in total, based on the overall adhesive, is not more than 80 wt %, preferably not more than 65 wt %, very preferably not more than 60 wt %. Too high a fraction of vinylaromatic block copolymers has the consequence, in turn, that the adhesive lacks sufficient adhesion.

The copolymer or copolymers, according to one preferred embodiment of the invention, are block copolymers having a molar mass $M_w$ (weight average) of 300 000 g/mol or less, preferably 200 000 g/mol or less, more preferably less than 130 000 g/mol. Smaller molar weights are preferred here, on account of their improved processing qualities.

In one advantageous variant, the block copolymer is a triblock copolymer, constructed from two terminal hard blocks and one middle soft block. Mixtures of triblock and diblock copolymers are likewise highly suitable. Great preference is given to using block copolymers of the polystyrene-block-polyisobutylene-block-polystyrene type. Systems of this kind have been disclosed under the designations SIBStar from Kaneka and Oppanol IBS from BASF. Further systems which can be employed advantageously are described in EP 1 743 928 A1. Commercially, there are hydrogenated vinylaromatic block copolymers known, for example, under the name Kraton from Kraton, as styrene-ethylene/butylene-styrene block copolymers, or under the name Septon, from Kuraray, as styrene-ethylene/propylene-styrene block copolymers.

The fact that the B blocks in the copolymer include a fraction of isobutylene or butylene as at least one kind of comonomer results in a nonpolar adhesive, affording advantageously low volume barrier properties particularly with respect to water vapor.

The adhesive may alternatively be a pressure-sensitive adhesive, which possesses a certain tack even at room temperature and can be bonded simply by pressure, or a hotmelt adhesive, which possesses very little tack, or none, at room temperature, and which requires heating in order to bond.

Owing to the chelate crosslinking of the hard blocks, the adhesives of the invention have very good Shear Adhesion Failure Temperature (SAFT) values. Thus for the adhesives of the invention it is possible to achieve SAFT values of greater than or equal to 150° C., more particularly greater than or equal to 180° C., preferably greater than or equal to 200° C., very preferably greater than or equal to 210° C., depending on the crosslinking and on the fraction of hard blocks.

Preferred B blocks for producing an adhesive of the invention are selected from polymeric B blocks, which independently are homopolymers or copolymers of monomeric alkenes having 2 to 8 C atoms, the monomers preferably being selected from ethylene, propylene, 1,3-dienes, particularly preferably from butadiene, isobutene and/or isoprene. For the success according to the invention it is particularly preferred if the B blocks are at least partly hydrogenated, more particularly substantially fully hydrogenated. A preferably full hydrogenation of the B blocks prevents sulfonation of the B blocks, allowing an adhesive with high transparency to be produced. Examples of nonpolar comonomers of the B blocks are suitably (partially) hydrogenated polybutadiene, (partially) hydrogenated polyisoprene and/or polyolefins.

Used as at least one metal complex with substitutable complexing agent is preferably as metal complex a metal chelate of the formula I, $$(R^1O)_nM(XR^2Y)_m \tag{I}$$

where M is a metal selected from metals from main groups 2, 3, 4, and 5 of the Periodic Table and from the transition metals, M being selected more particularly from aluminum, tin, titanium, zirconium, hafnium, vanadium, niobium, chromium, manganese, iron, cobalt, and cerium, with M more preferably being aluminum or titanium, and $R^1$ is an alkyl or aryl group, more particularly having 1 to 12 C atoms, such as methyl, ethyl, butyl, isopropyl, or benzyl;

n is 0 or a larger integer, more particularly 0, 1, 2, 3, or 4, n preferably being 0 or 1, X and Y in the chelate ligand ($XR^2Y$) independently are oxygen or nitrogen, which are optionally bonded to $R^2$ by a double bond; preferred chelate ligands are diones, such as 2,4-pentanedione, $R^2$ is an alkylene group which joins X and Y, more particularly a bifunctional alkylene group which is linear or branched, and optionally with heteroatom(s) in the alkylene group, more particularly oxygen, nitrogen, or sulfur;

m is an integer, but is at least 1, more particularly a number selected from 1, 2, or 3. In preferred metal chelates, M is selected from aluminum, titanium, and zirconium, with n being 0, 1, 2, or 3 and m being 1, 2, 3, or 4.

Preferred chelate ligands are those formed from the reaction of the following compounds: triethanolamine, 2,4-pentanedione, 2-ethyl-1,3-hexanediol, or lactic acid. Particularly preferred crosslinkers are aluminum acetylacetonates and titanyl acetylacetonates. Such as tris (acetylacetonato)aluminum, bis(acetylacetonato)titanium (IV) oxide, bis(pentane-2,4-dionato)titanium(IV) oxide.

In this context an approximately equivalent ratio should be selected between the sulfonic acid/sulfonic acid derivative groups and the acetylacetonate groups, in order to achieve optimum crosslinking, with a small excess of crosslinker having been found to be positive. The ratio between sulfonic acid or sulfonic acid derivative groups and acetylacetonate groups may be varied however, in which case none of the two groups ought to be present in more than a five-fold molar excess, for sufficient crosslinking. A preferred subject of the invention is an adhesive in which the molar ratio of the sulfonic acid groups in the (i) sulfonated copolymer to the ligand ($XR^2Y$), more particularly to an acetylacetonate ligand, in the (iii) metal complex of the formula I is in the range from 1:5 to 5:1, including the limiting values, more particularly in the range from 1:3 to 3:1, more particularly 1:2 to 2:1, preferably around 1:1 with a fluctuation range of plus/minus 0.5, more particularly 0.2.

In a further preferred embodiment, the PSA, in addition to the at least one vinylaromatic block copolymer, has at least one tackifier resin, in order to increase the adhesion in a desired way. The tackifier resin ought to be compatible with the elastomer block of the block copolymers.

As tackifier resins (tackifiers) in the PSA it is possible to use, for example, partially or fully hydrogenated resins based on rosin and rosin derivatives, hydrogenated polymers of dicyclopentadiene, partially, selectively or fully hydrogenated hydrocarbon resins based on $C_5$, $C_5/C_9$ or $C_9$ monomer streams, hydrogenated polymers of preferably pure $C_8$ and $C_9$ aromatics. Aforementioned tackifier resins may be used both alone and in a mixture. Not only resins which are solid at room temperature but also liquid resins may be employed here. In order to ensure high aging stability and UV stability, preference is given to hydrogenated resins having a degree of hydrogenation of at least 90%, preferably of at least 95%.

It is advantageous if this tackifier resin has a tackifier resin softening temperature of greater than 25° C., more particularly greater than or equal to 60° C., with further preference greater than or equal to 75° C. It is advantageous, furthermore, if in addition at least one kind of tackifier resin is used that has a tackifier resin softening temperature of less than 20° C. Via this component it is possible, if necessary, on the one hand to fine-tune the bonding performance, but on the other hand also to fine-tune the flow-on behavior on the bond substrate.

Preference is further given to nonpolar resins having a DACP (diacetone alcohol cloud point) of more than 30° C. and an MMAP (mixed methylcyclohexane aniline point) of greater than 50° C., more particularly having a DACP of more than 37° C. and an MMAP of greater than 60° C. The DACP and the MMAP values each indicate the solubility in a particular solvent. The selection of these ranges produces a particularly high permeation barrier, especially with respect to water vapor.

Besides the components already mentioned, adhesives of the invention may additionally comprise reactive resins as crosslinkers—possible examples are epoxy resins or low molecular mass acrylate compounds or methacrylate compounds—which may be crosslinked either thermally or photochemically. For photochemical crosslinking there is at least one photoinitiator present that absorbs UV light below 380 nm.

Epoxy resins are commonly understood to be both monomeric and oligomeric compounds having more than one epoxide group per molecule. They may be reaction products of glycidyl esters or epichlorohydrin with bisphenol A or bisphenol F or mixtures of both of these. Likewise possible for use are epoxy novolak resins obtained by reacting epichlorohydrin with the reaction product of phenols and formaldehyde. Monomeric compounds having two or more epoxide end groups, used as diluents for epoxy resins, can also be used. Likewise employable are elastically modified epoxy resins or epoxide-modified elastomers such as, for example, epoxidized styrene block copolymers, an example being Epofriend from Daicel.

Examples of epoxy resins are Araldite™ 6010, CY-281™, ECN™ 1273, ECN™ 1280, MY 720, RD-2 from Ciba Geigy, DER™ 331, 732, 736, DEN™ 432 from Dow Chemicals, Epon™ 812, 825, 826, 828, 830 etc. from Shell Chemicals, HPT™ 1071, 1079 likewise from Shell Chemicals, Bakelite™ EPR 161, 166, 172, 191, 194 etc. from Bakelite AG.

Commercial aliphatic epoxy resins are, for example, vinylcyclohexane dioxides such as ERL-4206, 4221, 4201, 4289 or 0400 from Union Carbide Corp.

Elasticized epoxy resins are available from Noveon under the name Hycar.

Epoxide diluents, monomeric compounds having a plurality of epoxide groups, are for example Bakelite™ EPD KR, EPD Z8, EPD HD, EDP WF, etc., from Bakelite AG, or Polypox™ R 9, R12, R 15, R 19, R 20 etc. from UCCP.

Epoxy resins here may be crosslinked both by means of heat and by means of UV light. In the case of crosslinking with the aid of heat, it is usual to use curing agents and accelerators. Accelerators here may be constructed on the basis of amines or anhydrides. Accelerators may come, for example, from the group of the tertiary amines or modified phosphines such as triphenylphosphine, for example.

Before a possible UV crosslinking, the adhesives are generally applied and, in noncrosslinked or partially crosslinked form in relation to the sulfonated copolymers, are supplied to the customer in the form, for example, of transfer tape or adhesive tape, with UV crosslinking then taking place subsequently at the customers premises. On account of their crosslinking characteristics, the adhesives thus crosslinked may also be referred to as Dualcore crosslinked.

The epoxy resins may be aromatic or more particularly aliphatic or cycloaliphatic in nature. Useful epoxy resins may be monofunctional, difunctional, trifunctional, tetrafunctional or more highly functional, up to polyfunctional in form, with the functionality pertaining to the cyclic ether group.

Examples, without wishing to be subject to any restriction, are 3,4-epoxycyclohexylmethyl 3',4'-epoxycyclohexanecarboxylate (EEC) and derivatives, dicyclopendadiene dioxide and derivatives, 3-ethyl-3-oxetanemethanol and derivatives, tetrahydrophthalic acid diglycidyl ester and derivatives, hexahydrophthalic acid diglycidyl ester and derivatives, 1,2-ethane diglycidyl ether and derivatives, 1,3-propane diglycidyl ether and derivatives, 1,4-butanediol diglycidyl ether and derivatives, higher 1,n-alkane diglycidyl ethers and derivatives, bis[(3,4-epoxycyclohexyl)methyl]adipate and derivatives, vinylcyclohexyl dioxide and derivatives, 1,4-cyclohexanedimethanol bis(3,4-epoxycyclohexanecarboxylate) and derivatives, 4,5-epoxytetrahydrophthalic acid diglycidyl ester and derivatives, bis[1-ethyl (3-oxetanyl)methyl]ether and derivatives, pentaerythrityl tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenyl novolaks, hydrogenated epoxyphenyl novolaks, epoxycresol novolaks, hydrogenated epoxycresol novolaks.

For UV crosslinking, moreover, the adhesive formulation optionally comprises at least one kind of a photoinitiator for the cationic curing of the reactive resins. Among the initiators for cationic UV curing, use may be made in particular of sulfonium-, iodonium-, and metallocene-based systems.

As examples of sulfonium-based cations, reference may be made to the descriptions in U.S. Pat. No. 6,908,722 B1 (especially columns 10 to 21). Examples of anions which serve as counterions to the aforementioned cations include tetrafluoroborate, tetraphenylborate, hexafluorophosphate, perchlorate, tetrachloroferrate, hexafluoroarsenate, hexafluoroantimonate, pentafluorohydroxyantimonate, hexachloroantimonate, tetrakispentafluorophenylborate, tetrakis(pentafluoromethylphenyl)borate, bi(trifluoromethylsulfonyl)amides, and tris(trifluoromethylsulfonyl)methides.

Further conceivable, especially for iodonium-based initiators, are chloride, bromide, or iodide as anions, although initiators which are substantially free from chlorine and bromine are preferred.

The systems which may be used more specifically include the following: sulfonium salts (see, for example, U.S. Pat. No. 4,231,951 A, U.S. Pat. No. 4,256,828 A, U.S. Pat. No. 4,058,401 A, U.S. Pat. No. 4,138,255 A and US 2010/063221 A1) such as triphenylsulfonium hexafluoroarsenate, to recite only a few, and without limiting the invention to them. Examples of commercialized photoinitiators are Cyracure UVI-6990, Cyracure UVI-6992, Cyracure UVI-6974, and Cyracure UVI-6976 from Union Carbide, and also other suitable photoinitiators. The skilled person is aware of further systems which may likewise be employed in accordance with the invention. Photoinitiators are used in uncombined form or as a combination of two or more photoinitiators.

Advantageous photoinitiators are those which exhibit absorption at less than 350 nm and advantageously at greater than 250 nm. Initiators which absorb at above 350 nm, in the violet light range, for example, may likewise be employed. Sulfonium-based photoinitiators are used with particular preference on account of their advantageous UV absorption characteristics.

The PSA is preferably not partly crosslinked or crosslinked to completion until after application, as for example after application on an electronic arrangement.

As maintained above, the adhesive of the invention may further comprise at least one kind of a reactive resin based on an acrylate or methacrylate for the radiation crosslinking and optionally thermal crosslinking. The reactive resins based on acrylates or methacrylates are, in particular, aromatic or, in particular, aliphatic or cycloaliphatic acrylates or methacrylates, more particularly as monomers, as polymers or as mixtures thereof.

Suitable reactive resins carry at least one (meth)acrylate function, preferably at least two (meth)acrylate functions. Using further compounds with at least one (meth)acrylate function of preferably higher (meth)acrylate functionality is possible in the sense of this invention.

If using low molecular mass acrylates as crosslinkers, photoinitiators are added which on irradiation with light form radicals, which then cause the acrylates to crosslink. The adhesive formulation further comprises at least one kind of a photoinitiator for the radical curing of these reactive resins. Advantageous photoinitiators are those which exhibit absorption at less than 350 nm and advantageously at greater than 250 nm. Initiators which absorb above 350 nm, in the violet light range, for example, can likewise be employed. Suitable representatives of photoinitiators for the radical curing are type I photoinitiators, in other words those known as α-splitters such as benzoin derivatives and acetophenone derivatives, benzil ketals or acylphosphine oxides, type II photoinitiators, in other words those known as hydrogen abstractors such as benzophenone derivatives and certain quinones, diketones, and thioxanthones. Triazine derivatives, furthermore, can be used to initiate radical reactions.

The adhesive may have been admixed with customary adjuvants such as aging inhibitors (antiozonants, antioxidants, light stabilizers, etc.).

Further additives which may typically be utilized are as follows:
  plasticizing agents such as, for example, plasticizer oils or low molecular mass liquid polymers such as, for example, low molecular mass polybutenes,
  primary antioxidants such as, for example, sterically hindered phenols,
  secondary antioxidants such as, for example, phosphites or thioethers,
  in-process stabilizers such as, for example, C radical scavengers,
  light stabilizers such as, for example, UV absorbers or sterically hindered amines,
  processing assistants,
  endblock reinforcer resins, and
  optionally further polymers of preferably elastomeric nature; elastomers utilizable accordingly include, among others, those based on pure hydrocarbons, as for example unsaturated polydienes such as natural or synthetically generated polyisoprene or polybutadiene, elastomers with substantial chemical saturation such as, for example, saturated ethylene-propylene copolymers, α-olefin copolymers, polyisobutylene, butyl rubber, ethylene-propylene rubber, and also chemically functionalized hydrocarbons such as, for example, halogen-containing, acrylate-containing, allyl ether-containing or vinyl ether-containing polyolefins.

In one embodiment of the present invention, the PSA also comprises fillers; by way of example, but without restriction, mention may be made of metal oxides, metal hydroxides, carbonates, nitrides, halides, carbides, or mixed oxide/hydroxide/halide compounds of the metals, selected from aluminum, silicon, zirconium, titanium, tin, zinc, iron, or the alkali or alkaline earth metals. These are essentially clay earths, as for example aluminum oxides, boehmite, bayerite, gibbsite, diaspore, and the like. Especially suitable are phyllosilicates such as, for example, bentonite, montmorillonite, hydrotalcite, hectorite, kaolinite, boehmite, mica, vermiculite, or mixtures thereof. However, carbon blacks or other modifications of carbon, such as carbon nanotubes, can also be used.

As fillers in the PSA it is preferred to use nanoscale and/or transparent fillers, employed as modified fillers with non-polar surfaces or crosslinkable surface molecules. In the present context a filler is termed nanoscale if in at least one dimension it has a maximum extent of about 100 nm, preferably from about 10 nm to in particular 0.001 nm. Particular preference is given to using those fillers which are transparent in the adhesive and have a platelet-shaped crystallite structure and a high aspect ratio with homogeneous distribution. The fillers with a platelet-like crystallite structure and with aspect ratios of well above 100 generally have a thickness of only a few nm, but the length and/or width of the crystallites may be up to several μm. Fillers of this kind are likewise referred to as nanoparticles. The particulate architecture of the fillers with small dimensions, moreover, is particularly advantageous for a transparent embodiment of the PSA.

Through the construction of labyrinthine structures by means of the fillers described above in the adhesive matrix, the diffusion pathway for, for example, oxygen and water vapor is extended in such a way that their permeation through the layer of adhesive is lessened. For improved dispersibility of these fillers in the binder matrix, these fillers may be surface-modified with organic compounds. The use of such fillers per se is known from US 2007/0135552 A1 and from WO 02/026908 A1, for example.

In another advantageous embodiment of the present invention, use is also made of fillers which are able to interact in a particular way with oxygen and/or water vapor. Water vapor or oxygen penetrating into the (opto)electronic arrangement is then chemically or physically bound to these fillers. These fillers are also referred to as getters, scavengers, desiccants or absorbers. Examples are cobalt chloride, calcium chloride, calcium bromide, lithium chloride, zinc chloride, zinc bromide, silicon dioxide (silica gel), aluminum oxide (activated aluminum), calcium sulfate, copper sulfate, sodium dithionite, sodium carbonate, magnesium carbonate, titanium dioxide, bentonite, montmorillonite, diatomaceous earth, zeolites and oxides of alkali metals and alkaline earth metals, such as barium oxide, calcium oxide, iron oxide and magnesium oxide, or else carbon nanotubes. Additionally it is also possible to use organic absorbers, examples being polyolefin copolymers, polyamide copolymers, PET copolyesters or other absorbers based on hybrid polymers, which are used generally in combination with catalysts such as cobalt, for example. Further organic absorbers are, for instance, polyacrylic acid with a low degree of crosslinking, ascorbates, glucose, gallic acid or unsaturated fats and oils.

In order to maximize the activity of the fillers in terms of the barrier effect, their fraction should not be too small. The fraction is preferably at least 5%, more preferably at least 10% and very preferably at least 15% by weight. Typically as high as possible a fraction of fillers is employed, without excessively lowering the bond strengths of the adhesive or adversely affecting other properties. Also advantageous is a very fine division and very high surface area on the part of the fillers. This allows a greater efficiency and a higher loading capacity, and is achieved in particular using nanoscale fillers.

According to one preferred embodiment of the invention, the fraction of fillers does not exceed a figure of 30% by weight, in order to minimize the effect on the bonding properties.

The fillers are not mandatory; the adhesive also operates without the addition thereof individually or in any desired combination.

In the area of adhesives, PSAs are notable in particular for their permanent tack and flexibility. A material exhibiting permanent pressure-sensitive tack must at any point in time have a suitable combination of adhesive and cohesive properties. For good adhesion properties it is appropriate to formulate PSAs in such a way that there is an optimum balance of adhesive and cohesive properties.

The adhesive is preferably a PSA, in other words a viscoelastic composition which remains permanently tacky and adhesive in the dry state at room temperature. Bonding is accomplished by gentle applied pressure instantaneously to virtually all substrates.

The invention also provides an adhesive which when cured or crosslinked yields values in the blister test of less than or equal to $50/cm^2$, preferably less than or equal to $40/cm^2$, more preferably less than or equal to $200/cm^2$, very preferably less than or equal to $10/cm^2$.

The adhesive is preferably not partially crosslinked or crosslinked to completion until after application, on the substrate to be bonded.

With further preference an adhesive is employed which in certain embodiments is transparent in the visible light of the spectrum (wavelength range from about 400 nm to 800 nm). The desired transparency can be achieved in particular through the use of colorless tackifier resins and by adjusting the compatibility of copolymer (in microphase-separated systems such as block copolymers and graft copolymers, with their soft block) and tackifier resin, but also with the reactive resin. Reactive resins are for this purpose selected advantageously from aliphatic and cycloaliphatic systems. "Transparency" here denotes an average transmittance of the adhesive in the visible range of light of at least 75%, preferably higher than 90%, this consideration being based on uncorrected transmission, in other words without subtracting losses through interfacial reflection. The adhesive preferably exhibits a haze of less than 5.0%, preferably less than 2.5%.

The PSA may be produced and processed from solution, from dispersion and from the melt. Preference is given to its production and processing from solution or from the melt. Particularly preferred is the manufacture of the adhesive from solution. In that case the constituents of the PSA are dissolved in a suitable solvent, for example toluene or mixtures of mineral spirit and acetone, and the solution is applied to the carrier using techniques that are general knowledge. In the case of processing from the melt, this may involve application techniques via a nozzle or a calender. In the case of processes from solution, coatings with doctor blades, knives, rollers or nozzles are known, to name but a few.

Likewise provided by the invention are sheetlike bonding means comprising the adhesive of the invention, with the sheetlike bonding means being selected from a sheetlike element of the adhesive, more particularly in the form of an adhesive transfer tape, preferably in the form of a sheetlike element of the adhesive with a layer covering partly at least the sheetlike element, and with the adhesive having been substantially dried. Furthermore, the sheetlike bonding means, more particularly a sheetlike element of the adhesive, may be an adhesive tape, in which case the adhesive tape has a carrier, more particularly a sheetlike carrier, and has the applied adhesive at least on one side of the carrier, the adhesive having been substantially dried. Said adhesive tape may be a single-sided or double-sided adhesive tape. Adhesive transfer tapes customarily have a release paper for the purpose of greater ease of production, storage, and processing. The adhesive of the invention can be used with particular advantage in a single-sided or double-sided adhesive tape. This mode of presentation permits particularly simple and uniform application of the adhesive.

The general expression "adhesive tape" encompasses a carrier material which is provided on one or both sides with a (pressure-sensitive) adhesive. The carrier material encompasses all sheetlike structures, examples being two-dimensionally extended films or film sections, tapes with an extended length and limited width, tape sections, diecuts (in the form of edge surrounds or borders of an (opto)electronic arrangement, for example), multi-layer arrangements, and the like. For different applications it is possible to combine a very wide variety of different carriers, such as, for example, films, with the adhesives. Furthermore, the expression "adhesive tape" also encompasses what are called "adhesive transfer tapes", i.e. an adhesive tape without carrier. In the case of an adhesive transfer tape, the adhesive is instead applied prior to application between flexible liners which are provided with a release coat and/or have anti-adhesive properties. For application, generally, first one liner is removed, the adhesive is applied, and then the second liner is removed. The adhesive can thus be used directly to join two surfaces in (opto)electronic arrangements.

Also possible, however, are adhesive tapes which operate not with two liners, but instead with a single liner with double-sided release. In that case the web of adhesive tape is lined on its top face with one side of a double-sidedly releasing liner, while its bottom face is lined with the reverse side of the double-sidedly releasing liner, more particularly of an adjacent turn in a bale or roll.

As the carrier material of an adhesive tape it is preferred in the present case to use polymer films, film composites, or films or film composites that have been provided with organic and/or inorganic layers. Such films/film composites may be composed of any common plastics used for film manufacture, examples—though without restriction—including the following: polyethylene, polypropylene—especially the oriented polypropylene (OPP) produced by mono-axial or biaxial stretching, cyclic olefin copolymers (COC), polyvinyl chloride (PVC), polyesters—especially polyethylene terephthalate (PET) and polyethylene naphthalate (PEN), ethylene-vinyl alcohol (EVOH), polyvinylidene chloride (PVDC), polyvinylidene fluoride (PVDF), polyacrylonitrile (PAN), polycarbonate (PC), polyamide (PA), polyether sulphone (PES) or polyimide (PI).

The carrier, moreover, may be combined with organic or inorganic coatings or layers. This can be done by customary techniques, such as surface coating, printing, vapor coating, sputtering, coextruding or laminating, for example. Examples—though without restriction—here include, for instance, oxides or nitrides of silicon and of aluminum, indium-tin oxide (ITO) or sol-gel coatings.

With particular preference, these films/film composites, especially the polymer films, are provided with a permeation barrier for oxygen and water vapor, the permeation barrier exceeding the requirements for the packaging sector (WVTR<$10^{-1}$ g/(m$^2$d); OTR<$10^{-1}$ cm$^3$/(m$^2$d bar)). Moreover, the films/film composites, in a preferred embodiment, may be transparent, so that the total construction of an adhesive article of this kind is also transparent. Here again, "transparency" means an average transmittance in the visible region of light of at least 75%, preferably higher than 90%.

In the case of double-sidedly (self-)adhesive tapes, the adhesives used as the top and bottom layer may be identical or different adhesives of the invention, and/or the layer thicknesses thereof that are used may be the same or different. The carrier in this case may have been pretreated according to the prior art on one or both sides, with the achievement, for example, of an improvement in adhesive anchorage. It is also possible for one or both sides to have been furnished with a functional layer which is able to function, for example, as a shutout layer. The layers of PSA may optionally be lined with release papers or release films. Alternatively it is also possible for only one layer of adhesive to be lined with a double-sidedly releasing liner.

Furthermore, the adhesive and also any adhesive tape formed using it are outstandingly suitable for the encapsulation of an electronic arrangement with respect to permeants, with the adhesive or adhesive tape being applied on and/or around the regions of the electronic arrangement that are to be encapsulated.

Encapsulation in the present case refers not only to complete enclosure with the stated PSA but also even application of the PSA to some of the regions to be encapsulated in the (opto)electronic arrangement: for example, a single-sided coverage or the enframing of an electronic structure.

With adhesive tapes it is possible in principle to carry out two types of encapsulation. Either the adhesive tape is diecut beforehand and bonded only around the regions that are to be encapsulated, or it is adhered by its full area over the regions that are to be encapsulated. An advantage of the second version is the easier operation and the frequently better protection.

The adhesive preferably being a PSA, application is particularly simple, since there is no need for preliminary fixing. PSAs permit flexible and clean processing.

An advantage of the present invention, then, in comparison to other PSAs, is the combination of very good barrier properties with respect to oxygen and especially to water vapor, in conjunction with good interfacial adhesion to different substrates, with good cohesive properties.

Of particular advantage for the processing of adhesives is if they are heated before, during or after the application of the PSA. As a result, the PSA is able to flow on even more effectively, and hence the permeation is reduced further at the interface between the substrate and the PSA. The temperature ought preferably to be more than 30° C., more preferably more than 50° C., in order to promote flow accordingly. In accordance with the invention the temperature for the drying and preliminary and final crosslinking of the adhesive can be above 100° C., also above 120° C.

Likewise provided by the invention is a process for producing an adhesive, and also an adhesive obtainable by the process, more particularly an adhesive as a permeant barrier, through combination of (i) block copolymers and also mixtures thereof, having an A-B-A, (A-B)$_n$, (A-B)$_n$X, or (A-B-A)$_n$X construction, where X is the radical of a coupling reagent, n is an integer between 2 and 10, A is a polymer block of a vinylaromatic, and B is a polymer block of an alkene or diene, it being possible for this polymer block also to be hydrogenated, with the proviso that at least some of the A blocks are sulfonated, and diblock copolymers of the form A-B, optionally, as an admixture component, more particularly independently a copolymer with A' being a polymer block of a vinylaromatic and B' being a polymer block of an alkene or diene, and (ii) at least one tackifier resin, and optionally
(iii) at least one metal complex with a substitutable complexing agent.

In one preferred process variant the block copolymer has A blocks derived from vinylaromatics and B blocks derived from alkenes or dienes such as linear or branched alkenes or dienes having 2 to 8 C atoms, with the B blocks being at least partially, preferably fully hydrogenated, and with the aromatics in the A blocks being partially sulfonated. A polymer is considered to be fully hydrogenated if the amount of double bonds is less than 5 mol % in relation to mol % of monomers employed.

Also provided by the invention is the use of an adhesive of the invention and also the process product of the aforesaid process, wherein the adhesive is partially crosslinked prior to application or is partially crosslinked or crosslinked to completion after application, more particularly by heating of the adhesive and/or of the element before, during, or after the application of the adhesive to the element. An adhesive of the invention further comprising an epoxy resin may be partially crosslinked thermally, preferably after or before application, and may be crosslinked to completion thermally and/or with UV light after application.

A further subject of the invention is the use of an adhesive or of a single-sided or double-sided adhesive tape formed with the adhesive, more particularly the use of an adhesive tape as an adhesive assembly for formation of barrier layers, preferably as an adhesive tape for formation of temperature-stable barrier layers, more particularly having a SAFT of greater than or equal to 180° C., more particularly greater than or equal to 200° C., as a barrier composition for preventing the diffusion of permeants, for encapsulating an electronic arrangement, for encapsulating an optoelectronic arrangement.

BRIEF DESCRIPTION OF THE DRAWINGS

Further details, objectives, features and advantages of the present invention are elucidated in more detail below with reference to a number of figures which show preferred exemplary embodiments:

FIG. 1 shows a first embodiment of an (opto)electronic arrangement 1. This arrangement 1 has a substrate 2 on which an electronic structure 3 is disposed. The substrate 2 itself is designed as a barrier for permeants and thus forms part of the encapsulation of the electronic structure 3. Disposed above the electronic structure 3, in the present case also at a distance from it, is a further cover 4 designed as a barrier.

Figure 1:
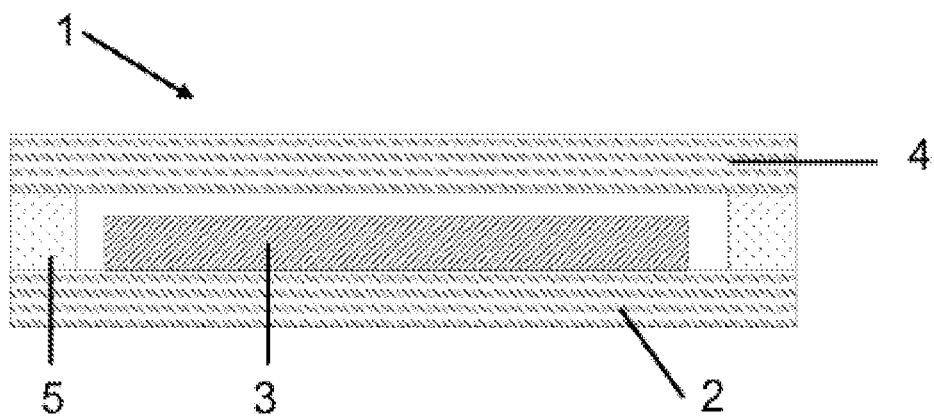
FIG. 1 shows a first (opto)electronic arrangement in a diagrammatic representation.

In order to encapsulate the electronic structure 3 to the side as well and at the same time to join the cover 4 to the electronic arrangement 1 in its remaining part, a pressure-sensitive adhesive (PSA) 5 runs round adjacent to the electronic structure 3 on the substrate 2. In other embodiments the encapsulation is accomplished not with a pure PSA 5, but instead with an adhesive tape 5 which comprises at least one PSA of the invention. The PSA 5 joins the cover 4 to the substrate 2. By means of an appropriately thick embodiment, moreover, the PSA 5 allows the cover 4 to be distanced from the electronic structure 3.

The PSA 5 is of a kind based on the PSA of the invention as described above in general form and set out in more detail below in exemplary embodiments. In the present case, the PSA 5 not only takes on the function of joining the substrate 2 to the cover 4 but also, furthermore, provides a barrier layer for permeants, in order thus to encapsulate the electronic structure 3 from the side as well with respect to permeants such as water vapor and oxygen.

In the present case, furthermore, the PSA 5 is provided in the form of a diecut comprising a double-sided adhesive tape. A diecut of this kind permits particularly simple application.

Figure 2:
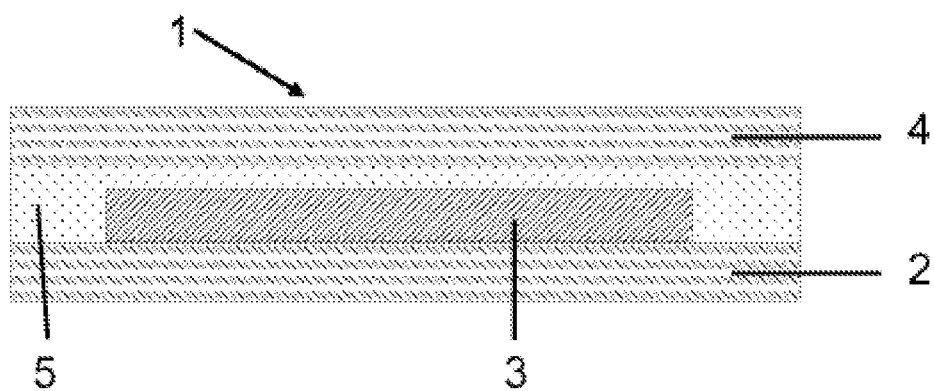
FIG. 2 shows a second (opto)electronic arrangement in a diagrammatic representation.

FIG. 2 shows an alternative embodiment of an (opto)electronic arrangement 1. Shown, again, is an electronic structure 3 which is disposed on a substrate 2 and is encapsulated by the substrate 2 from below. Above and to the side of the electronic structure, the PSA 5 is now in a full-area disposition. The electronic structure 3 is therefore encapsulated fully from above by the PSA 5. A cover 4 is then applied to the PSA 5. This cover 4, in contrast to the previous embodiment, need not necessarily fulfill the high barrier requirements, since the barrier is provided by the PSA itself. The cover 4 may merely, for example, take on a mechanical protection function, or else may also be provided as a permeation barrier.

Figure 3:
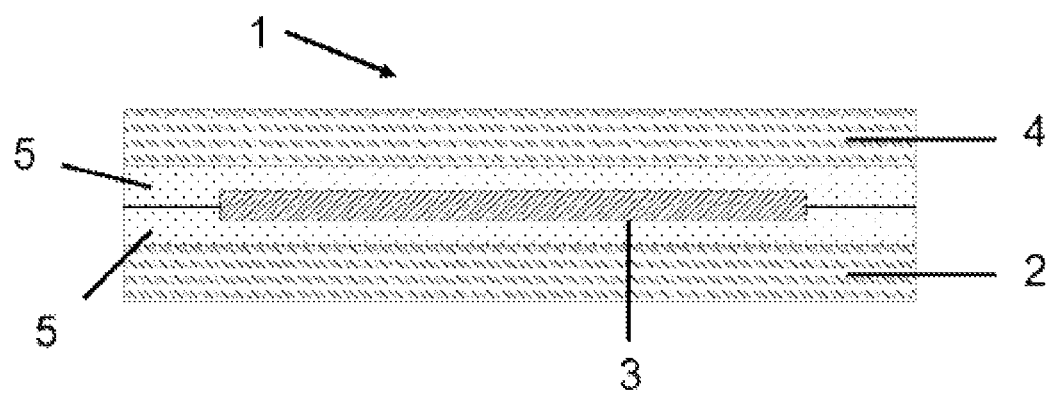
FIG. 3 shows a third (opto)electronic arrangement in a diagrammatic representation.

FIG. 3 shows a further alternative embodiment of an (opto)electronic arrangement 1. In contrast to the previous embodiments, there are now two PSAs 5a, 5b, which in the present case are identical in configuration. The first PSA 5a is disposed over the full area of the substrate 2. The electronic structure 3 is provided on the PSA 5a, and is fixed by the PSA 5a. The assembly comprising PSA 5a and electronic structure 3 is then covered over its full area with the other PSA, 5b, with the result that the electronic structure 3 is encapsulated on all sides by the PSAs 5a, b. Provided above the PSA 5b, in turn, is the cover 4.

In this embodiment, therefore, neither the substrate 2 nor the cover 4 need necessarily have barrier properties. Nevertheless, they may also be provided, in order to restrict further the permeation of permeants to the electronic structure 3.

In relation to FIG. 2, 3 in particular it is noted that in the present case these are diagrammatic representations. From the representations it is not apparent in particular that the PSA 5, here and preferably in each case, is applied with a homogeneous layer thickness. At the transition to the electronic structure, therefore, there is not a sharp edge, as it appears in the representation, but instead the transition is fluid and it is possible instead for small unfilled or gas-filled regions to remain. If desired, however, there may also be conformation to the substrate, particularly when application is carried out under vacuum or under increased pressure. Moreover, the PSA is compressed to different extents locally, and so, as a result of flow processes, there may be a certain compensation of the difference in height of the edge structures. The dimensions shown are also not to scale, but instead serve rather only for more effective representation. In particular, the electronic structure itself is usually of relatively flat design (often less than 1 µm thick).

In all of the exemplary embodiments shown, the PSA 5 is applied in the form of a pressure-sensitive adhesive tape. This may in principle be a double-sided pressure-sensitive adhesive tape with a carrier, or may be an adhesive transfer tape. In the present case, an adhesive transfer tape embodiment is selected.

The thickness of the PSA, present either as an adhesive transfer tape or as a coating on a sheetlike structure, is preferably between about 1 µm and about 150 µm, more preferably between about 5 µm and about 75 µm, and very preferably between about 12 µm and 50 µm. High layer thicknesses between 50 µm and 150 µm are employed when the aim is to achieve improved adhesion to the substrate and/or a damping effect within the (opto)electronic construction. A disadvantage here, however, is the increased permeation cross section. Low layer thicknesses between 1 µm and 12 µm reduce the permeation cross section, and hence the lateral permeation and the overall thickness of the (opto) electronic construction. However, there is a reduction in the adhesion on the substrate. In the particularly preferred thickness ranges, there is a good compromise between a low thickness of composition and the consequent low permeation cross section, which reduces the lateral permeation, and a sufficiently thick film of composition to produce a sufficiently adhering bond. The optimum thickness is dependent on the (opto)electronic construction, on the end application, on the nature of the embodiment of the PSA, and, possibly, on the sheetlike substrate.

For double-sided adhesive tapes it is likewise the case, for the barrier adhesive or adhesives, that the thickness of the individual layer or layers of PSA is preferably between about 1 µm and about 150 µm, more preferably between about 5 µm and about 75 µm, and very preferably between about 12 µm and 50 µm. If a further barrier adhesive is used in double-sided adhesive tapes as well as an inventive barrier adhesive, then it may also be advantageous for the thickness of said further barrier adhesive to be more than 150 µm.

The invention is elucidated in more detail below by means of a number of examples, without thereby wishing to restrict the invention.

Test Methods

Glass Transition Point ($T_g$)—

The glass transition point ($T_g$) of polymers and copolymers may be determined via Differential Scanning calorimetry, as described in DIN 53765. For this purpose, 7 mg of the sample are weighed out accurately into an aluminum crucible and then introduced into the measuring instrument (instrument: DSC 204 F1, from Netzsch). An empty crucible is used as a reference. Then two heating curves are recorded, with a heating rate of 10 K/min. The $T_g$ is determined from the second heating curve. Evaluation takes place via the instrument software.

Bond Strength—

The bond strength was determined as follows: The defined substrates used were glass plates (float glass). The bondable sheetlike element under investigation was cut to a width of 20 mm and a length of about 25 cm, provided with a handling section, and immediately thereafter pressed onto the selected substrate five times, using a 4 kg steel roller with a rate of advance of 10 m/min in each case. Immediately thereafter the above-bonded sheetlike element was peeled from the substrate at an angle of 180° at room temperature and at 300 mm/min, using a tensile testing instrument (from Zwick), and the force required to achieve this was recorded. The measurement (in N/cm) was obtained as the average from three individual measurements. The test specimens were non-crosslinked.

Shear Adhesion Failure Temperature (SAFT)—

The SAFT was determined as follows: The defined substrate used was a polished steel surface. The bondable sheetlike element under investigation was cut to a width of 10 mm and a length of about 5 cm, and immediately thereafter was pressed onto the selected substrate three times, using a 2 kg steel roller with a rate of advance of 10 m/min, with an area of 10×13 mm. Immediately thereafter, the above-bonded sheetlike element was loaded with 0.5 N at an angle of 180° and a temperature ramp of 9° C./min was run. During this ramp, measurements were made of the temperature at which the sample has travelled a slip distance of 1 mm. The measurement (in ° C.) is obtained as the average value from two individual measurements.

Permeability for Oxygen (OTR) and Water Vapor (WVTR)—

The permeability for oxygen (OTR) and water vapor (WVTR) is determined in accordance with DIN 53380 Part 3 and ASTM F-1249, respectively. For this purpose the PSA is applied with a layer thickness of 50 µm to a permeable membrane. The oxygen permeability is measured at 23° C. and a relative humidity of 50% using a Mocon OX-Tran 2/21 instrument. The water vapor permeability is determined at 37.5° C. and a relative humidity of 90%.

Transmittance—

The transmittance of the adhesive was determined via the VIS spectrum. The VIS spectrum was recorded on a Kontron UVIKON 923. The wavelength range of the spectrum measured encompasses all wavelengths between 800 nm and 400 nm, with a resolution of 1 nm. A blank channel measurement was carried out over the entire wavelength range, as a reference. For the reporting of the result, the transmittance measurements within the stated range were averaged. There is no correction for interfacial reflection losses. (T %: transmittance, with correction for reflection values)

Molecular Weight—

The average molecular weight $M_w$ (weight average) is determined by means of gel permeation chromatography (GPC). The eluent used is THF with 0.1% by volume trifluoroacetic acid. Measurement takes place at 25° C. The preliminary column used is PSS-SDV, 5 µm, $10^3$ Å, ID 8.0 mm×50 mm. Separation was carried out using the columns PSS-SDV, 5 µm, $10^3$ Å, $10^5$ Å and $10^6$ Å, each with an ID of 8.0 mm×300 mm. The sample concentration is 4 g/l, the flow rate 1.0 ml per minute. Measurement takes place against PS standards.

Bending Test—

For determination of the flexibility, the adhesive was coated in a layer thickness of 50 µm between two 23 µm PET carriers and tested to a bending radius of 1 mm on bending by 180°. A pass is scored in the test if there is no fracture or detachment of the layer.

Blister Test—

The adhesive sheet is adhered to a PET barrier film which has been provided with an inorganic barrier layer and has a thickness of 25 µm (WVTR@38° C./90% rH=8×10$^{-2}$ g/m$^{2*}$d and OTR@23° C./50% rH=6×10$^{-2}$ cm3/m$_2$*d*bar, correspondingly according to ASTM F-1249 and DIN 53380 Part 3 and conditions stated above) and rolled on with a rubber roller at room temperature (23° C.). The second side of the adhesive is subsequently bonded without bubbles to the same sheet and is likewise rolled on. After a peel increase time of 24 hours, the prepared specimen is stored at 85° C. and 85% rH for 20 hours. Examination is made to determine whether and, if so, when blisters appear in the composite, and also with determination both of the number of blisters per cm$^2$ and of their average size. The time to appearance of first blisters is noted.

EXAMPLES

General Preparation Examples, Sulfonation

General examples are given below of possible sulfonation processes:

a) A 10% (w/v) solution of SIBS (50 g) in methylene chloride (500 ml) is prepared. The solution is stirred and is heated to about 40° C. under reflux in a nitrogen atmosphere. Acetyl sulfate as sulfonating agent is prepared in methylene chloride. This is done by providing 150 ml of methylene chloride in an ice bath. Subsequently, acetic anhydride is introduced in line with the desired degree of sulfonation. The acetic anhydride is added with a 1.5:1 molar ratio to the concentrated sulfuric acid in excess. The concentrated sulfuric acid is then slowly added via a dropping funnel with stirring. The mixture is then homogenized for about 10 minutes. During this time there must be no coloration. The acetyl sulfate solution is then transferred in turn into a dropping funnel, and is added slowly dropwise to the warm polymer solution over 10 to 30 minutes. After about 5 hours, the reaction is ended by slow addition of 100 ml of methanol. The reacted polymer solution is then precipitated in deionized water. The precipitate is washed a number of times with water and then dried in a vacuum oven at 50° C. for 24 hours.

b) Derived from U.S. Pat. No. 3,642,953 A is the following process: SIBS as a block polymer with average block molecular weights of 10 000-127 000-10 000 (14.3 g) was dissolved in dry diethyl ether (1000 g) and the solution was filtered and cooled to 0° C. Added slowly to the polymer solution was a mixture of 8.8 g of chlorosulfonic acid taken up in 100 g of dry diethyl ether. The reaction temperature was held at 0° C. to 5° C. for 30 minutes. During this time, the polymer precipitates from the solution and hydrogen chloride is produced. At the end of the reaction time, the mixture was warmed to room temperature, the ether was decanted from the product, and the precipitated product was washed three times with ether. The two aforesaid processes can optionally be employed, with modification, to all sulfonations according to the invention, in principle. The invention also provides copolymers comprising sulfonated copolymers obtainable by the aforementioned processes in a mixture with unsulfonated copolymers.

Production of the Specimens—

The PSAs in examples 1 to 3 were prepared from solution. This was done by dissolving the individual constituents in THF/toluene/methanol 80/10/10 (solids fraction 40%) and coating the solution onto an untreated 23 μm PET film, which was subsequently dried at 120° C. for 15 minutes, giving a layer of adhesive having a weight per unit area of 50 g/m².

Example 1

A 10% (w/v) solution of SIBS Sibstar 103T (50 g) in methylene chloride (500 ml) is prepared. The solution is stirred and is heated to about 40° C. under reflux in a nitrogen atmosphere. Acetyl sulfate as sulfonating agent is prepared in methylene chloride. This is done by providing 150 ml of methylene chloride in an ice bath. Subsequently, correspondingly, 2.57 g of acetic anhydride are introduced. The acetic anhydride is added to the concentrated sulfuric acid in excess. 1.41 g of the concentrated sulfuric acid is then added slowly via a dropping funnel with stirring. The mixture is then homogenized for about 10 minutes. During this time there must be no coloration. The acetyl sulfate solution is then added slowly dropwise to the warm polymer solution for 10 to 30 minutes. After about 5 hours, the reaction is ended by slow addition of 100 ml of methanol. The reacted polymer solution is then precipitated in cold methanol. The precipitate is washed a number of times with methanol and water and then dried in a vacuum oven at 80° C. for 24 hours. The sulfonic acid fraction of a polymer prepared in this way is ~7 mol %.

Adhesive Composition

Example 1

| 100 parts | SiBStar 103T | Triblock SiBS with 30 wt % block polystyrene content from Kaneka, 7 mol % sulfonation |
| 30 parts | SiBStar 042D | Diblock SiB with 15 wt % block polystyrene content from Kaneka |
| 130 parts | Regalite 1090 | Hydrogenated HC resin with softening point of 90° C. from Eastman |
| 30 parts | Ondina G 17 | White oil comprising paraffinic and naphthenic fractions from Shell |
| 3 parts | | Aluminum acetylacetonate |
| 2 parts | | Pentanedione |

Example 2

| 50 parts | Kraton G1652 M | SEBS (styrene-ethylene-butylene-styrene) with 30 wt % block polystyrene content from Kraton, 7 mol % sulfonation |
| 50 parts | Kraton G1657 M | SEBS with 13 wt % block polystyrene content from Kraton and a diblock fraction of 29 mol % |
| 70 parts | Escorez 5600 | Hydrogenated HC resin with softening point of 100° C. from Exxon |
| 25 parts | Ondina G 17 | White oil comprising paraffinic and naphthenic fractions from Shell |
| 2.5 parts | | Aluminum acetylacetonate |
| 2.5 parts | | Pentanedione |

Example 3

| 50 parts | Septon 4033 | Triblock SEEPS (styrene-ethylene/(ethylene-propylene)-styrene) with 30 wt % block polystyrene content from Kuraray, sulfonated at 7 mol % |
| 50 parts | Septon 2063 | Triblock SEPS with 13 wt % block polystyrene content from Kuraray |
| 120 parts | Foral 85 | Hydrogenated rosin with a softening point of 85° C. from Eastman |
| 10 parts | Wingtack 10 | Plasticizer resin from Cray Valley |
| 1 part | | Aluminum acetylacetonate |
| 1 part | | Pentanedione |

Adhesive Composition

Comparative Example 1

| 100 parts | SiBStar 103T | Triblock SiBS with 30 wt % block polystyrene content from Kaneka |
| 30 parts | SiBStar 042D | Diblock SiB with 15 wt % block polystyrene content from Kaneka |
| 130 parts | Regalite 1090 | Hydrogenated HC resin with softening point of 90° C. from Eastman |
| 30 parts | Ondina G 17 | White oil comprising paraffinic and naphthenic fractions from Shell |

Comparative Example 2

| 50 parts | Kraton G 1652M | Triblock SEBS with 30 wt % block polystyrene content from Kraton |
| 50 parts | Kraton G 1657M | SEBS with 13 wt % block polystyrene content from Kraton. The SEBS had a diblock content of about 29 mol %. |
| 70 parts | Escorez 5600 | Hydrogenated HC resin with softening point of 100° C. from Exxon |
| 25 parts | Ondina G 17 | White oil comprising paraffinic and naphthenic fractions from Shell |

Comparative Example 3

| 50 parts | Septon 4033 | Triblock SEEPS (styrene-ethylene/(ethylene-propylene)-styrene) with 30 wt % block polystyrene content from Kuraray |
| 50 parts | Septon 2063 | Triblock SEPS with 13 wt % block polystyrene content from Kuraray |
| 120 parts | Foral 85 | Hydrogenated rosin with a softening point of 85° C. from Eastman |
| 10 parts | Wingtack 10 | Plasticizer resin from Cray Valley |

TABLE 1

Testing of the examples

| | Bond strength | SAFT | T % | Blister test | WVTR | OTR | Bending test |
|---|---|---|---|---|---|---|---|
| Example 1 | 5.5 | 210 | 90 | <10/cm² | 9.7 | 2600 | pass |
| Example 2 | 6.4 | 210 | 88 | <10/cm² | 93 | 6930 | pass |
| Example 3 | 4.7 | 210 | 88 | <10/cm² | 42 | 3000 | pass |
| Comparative example 1 | 3.8 | 120 | 90 | >100/cm² | 8.7 | 3000 | pass |

TABLE 1-continued

Testing of the examples

| | Bond strength | SAFT | T % | Blister test | WVTR | OTR | Bending test |
|---|---|---|---|---|---|---|---|
| Comparative example 2 | 4.2 | 110 | 88 | >100/cm$^2$ | 89 | 7280 | pass |
| Comparative example 3 | 3.9 | 105 | 88 | >100/cm$^2$ | 73 | 6000 | pass |

As can be seen in the table above, there is an increase in the adhesion of the sulfonated adhesive on polar substrates, and in the thermal shear strength. Measurement was ended at 210° C., since this represents the maximum of the temperature control unit. In contrast, the noncrosslinked systems exhibit the temperature failure, typical of styrene block copolymer, between 100° C. to 120° C., resulting from the softening of the styrene domains. With these adhesives, the nonpolar character is predominant, as evident in the somewhat poorer bond strength to steel. As can be seen, sufficient bond strengths were achievable in all examples on all substrates, and excellent resistance at elevated temperatures was achievable in the case of the examples 1, 2 and 3.

As is apparent, the blocking effect of the instantaneous adhesive tapes from the first two examples is in fact somewhat better than in the case of comparative example C1 and C2, with similar transmittance in the visible range of light. The former fact is surprising to the skilled person, since the functionalization increases the polarity of the adhesives and thus at least the WVTR ought to be higher by comparison with the nonpolar comparative adhesive. In addition, the tendency under humid temperature storage (60° C./95% rH) to develop blisters is significantly reduced in the case of the crosslinked adhesive.

Adhesive Composition

Example 4

| 100 parts | SiBStar 103T | Triblock SiBS with 30 wt % block polystyrene content from Kaneka, sulfonated at 4 mol % |
| 30 parts | SiBStar 042D | Diblock SiB with 15 wt % block polystyrene content from Kaneka |
| 130 parts | Regalite 1090 | Hydrogenated HC resin with softening point of 90° C. from Eastman |
| 30 parts | Ondina G 17 | White oil comprising paraffinic and naphthenic fractions from Shell |
| 1 part | | Aluminum acetylacetonate |
| 1 part | | Pentanedione |

Example 5

| 50 parts | Kraton G 1652M | Triblock SEBS with 30 wt % block polystyrene content from Kraton, sulfonated at 4 mol % |
| 50 parts | Kraton G 1657 | SEBS with 13 wt % block polystyrene content from Kraton. The SEBS had a diblock content of about 36 mol %. |
| 70 parts | Escorez 5600 | Hydrogenated HC resin with softening point of 100° C. from Exxon |
| 25 parts | Ondina G 17 | White oil comprising paraffinic and naphthenic fractions from Shell |
| 1 part | | Aluminum acetylacetonate |
| 1 part | | Pentanedione |

Example 6

| 30 parts | Kraton G 1652M | Triblock SEBS with 30 wt % block polystyrene content from Kraton, sulfonated at 4 mol % |
| 30 parts | Epikote 862 | Bisphenol A epoxy resin with an epoxy equivalent of 172 from Hexion |
| 30 parts | Regalite 1090 | Hydrogenated HC resin with softening point of 90° C. from Eastman |
| 1 part | Photoinitiator | Bis(4-tert-butylphenyl)iodonium hexafluorophosphate Sigma Aldrich |
| 1 part | | Aluminum acetylacetonate |
| 1 part | | Pentanedione |

Comparative Example 4

| 30 parts | Kraton G 1652M | Triblock SEBS with 30 wt % block polystyrene content from Kraton |
| 30 parts | Epikote 862 | Bisphenol A epoxy resin with an epoxy equivalent of 172 from Hexion |
| 30 parts | Regalite 1090 | Hydrogenated HC resin with softening point of 90° C. from Eastman |
| 1 part | Photoinitiator | Bis(4-tert-butylphenyl)iodonium hexafluorophosphate Sigma Aldrich |

TABLE 2

Testing of the examples

| | Bond strength | SAFT | T % | Blister test | WVTR | OTR | Bending test |
|---|---|---|---|---|---|---|---|
| Example 4 | 5.1 | 210 | 90 | <10/cm$^2$ | 9.7 | 2600 | pass |
| Example 5 | 5.9 | 210 | 88 | <10/cm$^2$ | 93 | 6930 | pass |
| Example 6 | 1.4 | 210 | 88 | <10/cm$^2$ | 7 | 300 | pass |
| Comparative example 4 | 1.5 | 210 | 88 | <10/cm$^2$ | 8 | 600 | pass |

The values for example 6 and comparative example 4 were recorded after UV curing with a conveyor belt system: mercury vapor lamp, 80 mJ/cm$^2$, 10 m/min, 160 W/cm.

Example 7

| 100 parts | SiBStar M62 (sulfonated) | SiBS with 30 wt % block polystyrene content from Kaneka, sulfonated at 16 mol % |
| 100 parts | Regalite 1090 | Hydrogenated HC resin with softening point of 90° C. from Eastman |
| 20 parts | Ondina G 17 | White oil comprising paraffinic and naphthenic fractions from Shell |

Comparative Example 5

| 100 parts | SiBStar M62 | SiBS with 30 wt % block polystyrene content from Kaneka |
| 100 parts | Regalite 1090 | Hydrogenated HC resin with softening point of 90° C. from Eastman |
| 20 parts | Ondina G 17 | White oil comprising paraffinic and naphthenic fractions from Shell |

TABLE 3

Testing of example 7 and of comparative example 5

| | Bond strength | SAFT | T % | Blister test | WVTR | OTR | Bending test |
|---|---|---|---|---|---|---|---|
| Example 7 | 3.5 | 150 | 90 | <10/cm² | 12 | 2100 | pass |
| Comparative example 5 | 3.2 | 90 | 89 | >100/cm² | 9 | 3000 | pass |

The invention claimed is:

1. An adhesive comprised of
(i) block copolymers and also mixtures thereof, having an A-B-A, (A-B)$_n$X, or (A-B-A)$_n$X construction, where X is the radical of a coupling reagent, n is an integer between 2 and 10, A is a polymer block of a vinylaromatic, and B is a polymer block of an alkene or diene, and where the A blocks are sulfonated to the extent of 0.5 to 50 mol %, based on the total monomer units of the A blocks, and diblock copolymers of the form A-B optionally as admixture component, and
(ii) at least one tackifier resin.

2. The adhesive as claimed in claim 1, wherein B is a hydrogenated polymer block of an alkene or diene.

3. The adhesive as claimed in claim 1 wherein 0.5 to 50 mol % of the block copolymers are in the form of sulfonated copolymers and have sulfonated A blocks, the aromatic moieties of which are sulfonated to an extent of 0.5 to 20 mol % per mole of the monomer unit, based on the total monomer units of the A blocks in the sulfonated copolymer.

4. The adhesive as claimed in claim 1, further comprising (iii) at least one metal complex with a substitutable complexing agent.

5. The adhesive as claimed in claim 1, wherein the admixture component is a diblock copolymer of the form A-B, a copolymer with polymer blocks A' of vinylaromatics and polymer blocks B' of an alkene or diene.

6. The adhesive as claimed in claim 1, wherein (i) the A blocks each independently have a $T_g$ of more than 40° C. and the B blocks each independently have a $T_g$ of less than 0° C.

7. The adhesive as claimed in claim 1, wherein the B blocks independently are homopolymers or copolymers of monomers selected from the group consisting of ethylene, propylene and 1,3-dienes.

8. The adhesive as claimed in claim 1, wherein the B blocks are at least partially hydrogenated.

9. The adhesive as claimed in claim 1, wherein the A blocks independently are homopolymers or copolymers of monomers of at least one vinylaromatic.

10. The adhesive as claimed in claim 1, wherein the metal complex with a substitutable complexing agent corresponds to a metal chelate of the formula I, $$(R^1O)_nM(XR^2Y)_m \quad (I)$$

where M is a metal selected from the group consisting of metals of main groups 2, 3, 4, and 5 of the Periodic Table of the Elements and from the transition metals, and R$^1$ is an alkyl or aryl group,
n is 0 or a larger integer
X and Y in the chelate ligand (XR$^2$Y) independently are oxygen or nitrogen, which are optionally bonded to R$^2$ by a double bond,
R$^2$ is an alkylene group which joins X and Y and which is linear or branched, and optionally has heteroatom(s) in the alkylene group, nitrogen, or sulfur;
m is an integer, but is at least 1.

11. The adhesive as claimed in claim 10, wherein the chelate ligand in the metal chelate is formed from the reaction of at least one of the compounds selected from the group consisting of triethanolamine, 2,4-pentanedione, 2-ethyl-1,3-hexanediol and lactic acid.

12. The adhesive as claimed in claim 1, wherein the overall composition of the adhesive contains
(ii) at 10 to 70 wt %, at least one tackifier resin, and/or an epoxy resin, and
(iii) at least one metal complex with a substitutable complexing agent, and optionally
(iv) up to 20 wt %, a plasticizer, and
(v) 0.0 to 20 wt %, fillers, additives, photoinitiators, accelerators and/or curing agents,
(vi) up to 60 wt %, a reactive resin, and
(i) the block copolymers and/or mixtures comprising them, to 100 wt %.

13. The adhesive as claimed in claim 8, wherein the fraction in wt % of the vinylaromatics of the A blocks in the (i) copolymer in relation to the overall composition of the adhesive is at least 20 to 85 wt %.

14. The adhesive as claimed in claim 1, wherein the molar ratio of the sulfonic acid groups in the (i) sulfonated copolymer to the ligand (XR$^2$Y) in the (iii) metal complex of the formula I is in the range from 1:3 to 3:1, with a fluctuation range of plus/minus 0.5.

15. The adhesive as claimed in claim 1, having a SAFT of greater than or equal to 150° C.

16. The adhesive as claimed in claim 1, comprising as tackifier resins at least one hydrogenated hydrocarbon resin.

17. The adhesive as claimed in claim 1, comprising an epoxy resin, an acrylate and/or a methacrylate, and wherein the adhesive, optionally together with at least one reactive resin, comprises at least one photoinitiator absorbing UV light below 350 nm.

18. The adhesive as claimed in claim 1, wherein the chelate-crosslinked adhesive has a WVTR of less than or equal to 100 g/m²·d, and/or the chelate-crosslinked adhesive has an OTR of less than or equal to 3000 g/m²·d·bar.

19. The adhesive as claimed in claim 1, said adhesive being a pressure-sensitive adhesive or a hotmelt adhesive.

20. A process for producing an adhesive which comprises mixing
(i) block copolymers and also mixtures thereof, having an A-B-A, (A-B)$_n$X, or (A-B-A)$_n$X construction, where X is the radical of a coupling reagent, n is an integer between 2 and 10, A is a polymer block of a vinylaromatic, and B is a polymer block of an alkene or diene, this polymer block being hydrogenated, with the proviso that at least some of the A blocks are sulfonated, and diblock copolymers of the form A-B, optionally, as admixture component, and
(ii) at least one tackifier resin.

21. The process for producing an adhesive as claimed in claim 20, wherein additionally
(iii) at least one metal complex with a substitutable complexing agent and optionally as (ii) tackifier resin a substantially fully hydrogenated hydrocarbon resin, (iv) a plasticizer, and optionally (v) a filler, additive, accelerator, photoinitiator and/or optionally (vi) a reactive resin, together with at least one photoinitiator, are added.

22. An adhesive obtainable by a process according to claim 20.

23. A method for applying the adhesive of claim 1 to an element, wherein the adhesive is partially crosslinked prior to application or is partially crosslinked or crosslinked to completion after application, by heating of the adhesive and/or of the element before, during, or after the application of the adhesive to the element.

24. The method of claim 23, wherein the adhesive is thermally partially crosslinked prior to an application, and following the application, crosslinking to completion is accomplished thermally and/or with UV light after the application.

25. An adhesive assembly for formation of temperature-stable barrier layers, having a SAFT of greater than or equal to 180° C., for preventing the diffusion of permeants, for encapsulating an electronic arrangement, or for encapsulating an optoelectronic arrangement, wherein said assembly comprises the adhesive of claim 1.

26. A sheetlike bonding means comprising the adhesive of claim 1, the sheetlike bonding means being a sheetlike element of the adhesive or an adhesive tape, the adhesive tape having a carrier and, on at least one side of the carrier, the applied adhesive, and the adhesive of the sheetlike bonding means being substantially dried.

* * * * *